United States Patent [19]

Lin

[11] Patent Number: 4,993,972

[45] Date of Patent: Feb. 19, 1991

[54] MULTI-PURPOSE PC BOARD CONNECTOR

[76] Inventor: Yu C. Lin, 2Fl., No. 12, Lane 121, Lihsing Rd., Sec. 2, Sanchung, Taiwan

[21] Appl. No.: 476,351

[22] Filed: Feb. 7, 1990

[51] Int. Cl.[5] .................. H05K 1/00

[52] U.S. Cl. .................. 439/637; 439/633; 439/681

[58] Field of Search .................. 439/60, 55, 630-637, 439/677, 681, 680

[56] References Cited

U.S. PATENT DOCUMENTS 3,399,372 8/1968 Uberbacher .................. 439/60
3,614,714 10/1971 Silverstein .................. 439/633
3,675,186 7/1972 Jayne et al. .................. 439/633
3,818,280 6/1974 Smith et al. .................. 439/633
4,869,672 9/1989 Andrews .................. 439/60

*Primary Examiner*—David L. Pirlot

*Attorney, Agent, or Firm*—Erik M. Arnhem

[57] ABSTRACT

An electrical connector that includes a dielectric body having a panel-reception groove and a relatively large number of conductive spring elements extending along side surfaces of the groove to engage conductive strips carried on the panel. Special spacer pads are removably disposed in end areas of the groove to variably limit the insertion of the panel into the groove, thus removing selected ones of the conductive spring elements from connection with the conductive strips. As a further feature, special spacer blocks may be located at the end of the groove to effectively reduce the width of the groove, thus enabling the groove to accept panels having reduced width dimensions. The invention seeks to increase the versatility of the electrical connector, and to reduce the need for a large multiplicity of differently constructed connectors.

6 Claims, 9 Drawing Sheets

MULTI-PURPOSE PC BOARD CONNECTOR

This invention relates to a multi-purpose personal computer (PC) board connector of the plug-on-type, i.e. a dielectric body having a thin rectangular groove having a series of conductive elements extending along the groove internal side surface for engagement with conductive strips carried on the side surface of a panel-type connector element insertable into the groove. The female dielectric body will typically have a relatively large number of conductive elements located within the panel-insertion groove. The transverse width and lateral spacing of the conductive elements is therefore relatively small. Consequently the panel should fit rather snugly into the groove with minimal transverse play. Also, the conductive elements within the groove should have a relatively controlled contact pressure on the associated conductive strips on the inserted panel, in order to avoid weak electrical connections or excessive force requirements for inserting or removing the plug-in panel.

Conventional connectors are designed with a specific groove size and a specific number of conductive elements spaced along the groove side surfaces. There is thus an undesired duplication or proliferation of connectors involved in providing a system of connectors suited to receiving panels having differing widths or different numbers of conductive strips thereon, i.e. different strip spacings.

SUMMARY OF THE INVENTION

The present invention contemplates a dielectric connector body having a panel-reception groove equipped with removable spacer pads at its ends, whereby the effective depth dimension of the groove is variable, such that the associated plug-in panel can have different length dimensions thereof inserted into the groove (depending on the number of spacer pads stocked in the ends of the groove)

The conductive elements within the dielectric connector body are individually formed as spring elements having portions thereof projecting into the groove space, whereby when the panel is inserted into the groove the projecting portions of the spring elements have sliding (wiping) contact on the conductive strips on the panel. Each spring element has essentially the same spring action and stroke, such that each spring element has a reasonable contact pressure, while the array of spring elements requires only a reasonable degree of force for the insertion of the panel into the groove or removal of the panel from the groove.

The spring elements have a common length. However, the projecting (contact) portions of different spring elements are located different distances from the ends of the spring elements. In a typical arrangement there are five different spring element orientations or groups. The spring elements in the five groups have their contact portions spaced five different distances from the groove bottom wall, such that when the panel is inserted into the groove selected numbers of the spring elements will have electrical engagement with the conductive strips on the panel, dependent on the length of the panel inserted into the groove. With full penetration of the panel into the groove all of the spring elements will be utilized. As the panel is inserted into the groove to a lesser extent (length) the number of spring elements in circuit will be correspondingly decreased.

The use of spacer pads in combination with spring elements having different contact locations, enables the dielectric connector body to be used with panels having different numbers of conductive strips and different conductive strip spacings.

As another feature of the invention, special spacer blocks are provided for disposition within end areas of the panel-reception groove. These blocks, when used, effectively reduce the transverse width dimension of the groove, thereby enabling the connector to be used with plug-in panels having reduced width dimension and lesser numbers of conductive strips. An aim of the invention is to provide a connector adapted to receive a variety of different width plug-in panels, there by increasing the versatility and usefulness of the connector.

THE DRAWINGS

FIG. 1 is a perspective view of connector body embodying the invention. Parts of the connector are broken away to illustrate interior details. Also, certain associated spacer pads and panels are shown in phantom.

DESCRIPTION OF A PREFERRED EMBODIMENT OF THE INVENTION

Figure 1:
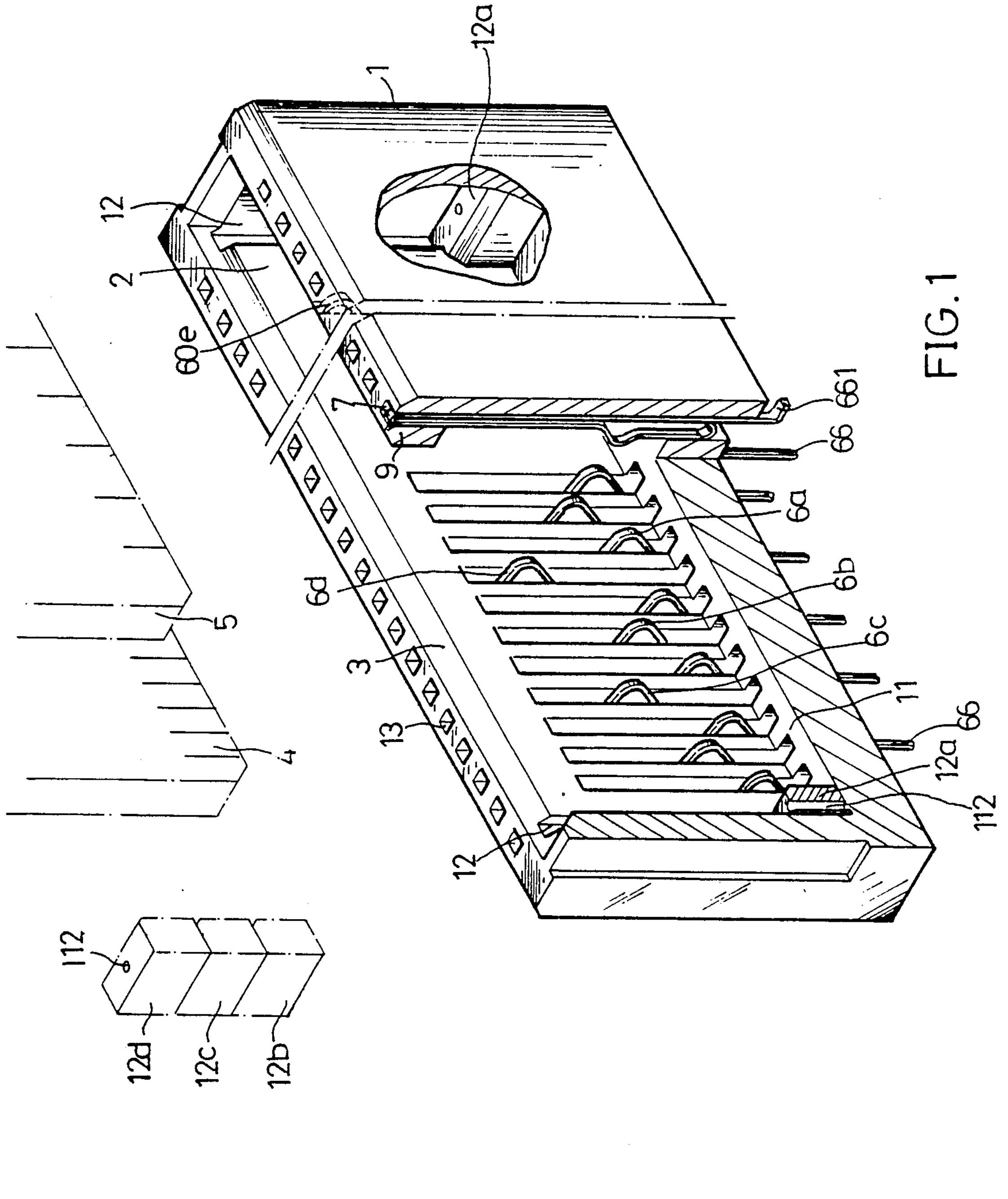
FIG. 1A shows two possible contact arrangements usable in practice of the invention.

FIG. 1 shows a connector of the present invention that includes a dielectric connector body 1 having a generally rectangular panel-reception groove 2 extending vertically downwardly within the dielectric body from an upper exposed face, not numbered. Panels 4 and 5 can be selectively (alternately) inserted into groove 2, such that electrical circuits are completed between conductive spring elements **6*a*, 6*b*, 6*c* 6*d* and 6*e* in body 1 and conductive strips extending vertically (upwardly) along the surface of panel 4 or 5 from its respective lower edge. The conductive strips are shown figuratively on panels 4 and 5. As shown, the strips on panel 4 are closely spaced, whereas the conductive strips on panel 5** are more widely spaced.

Figure 2A:
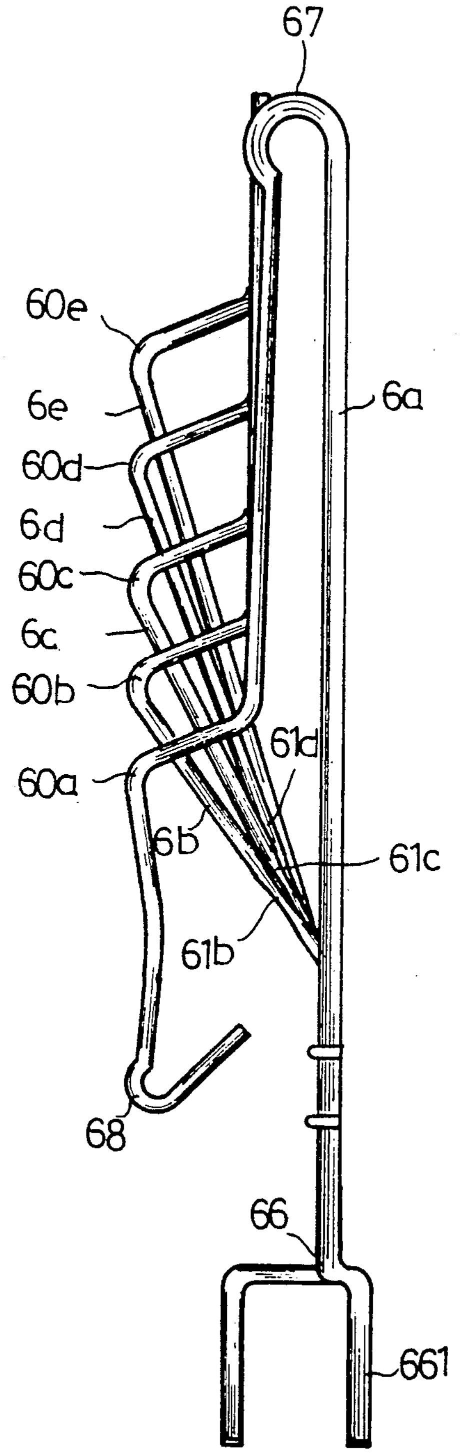
FIG. 2A is a side elevational view of an array of conductive spring elements used in the FIG. 1 connector.
Figure 2B:
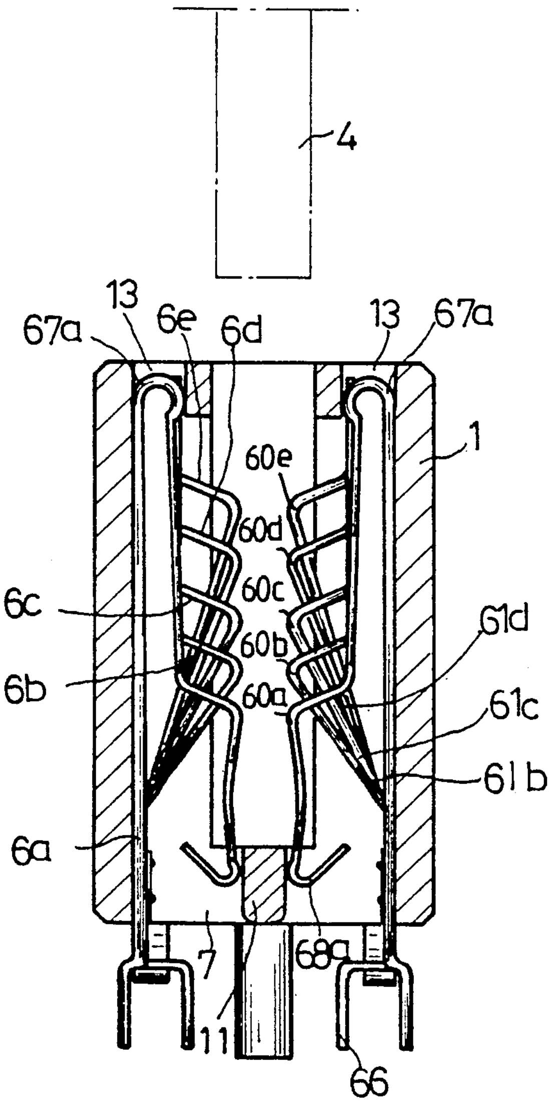
FIG. 2B is a transverse sectional view taken through the FIG. 1 connector and showing the placement of the FIG. 2A spring elements in the connector body.
Figure 2C:
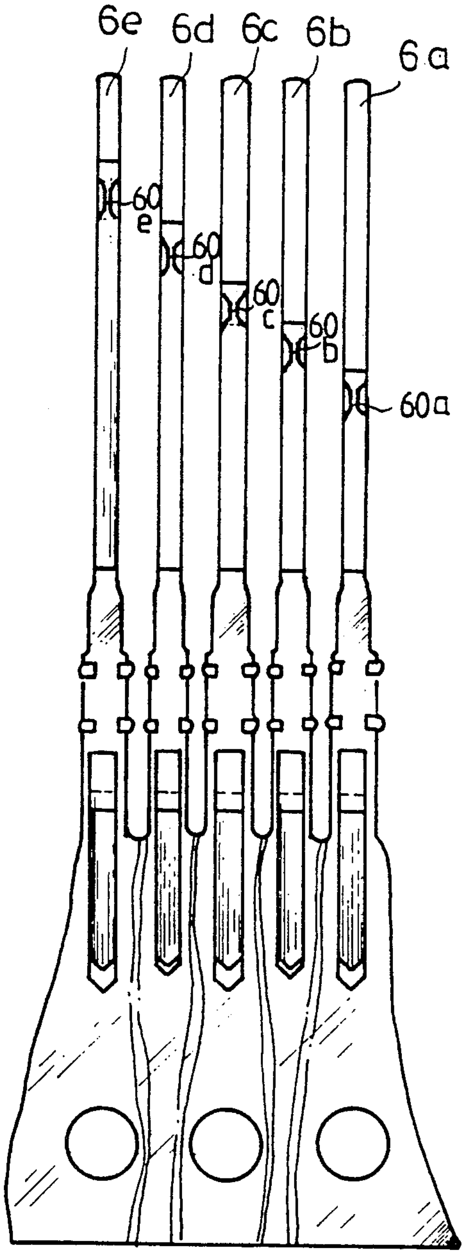
FIG. 2C is a front elevational view of the spring elements depicted in FIG. 2A.

FIGS. 2A and 2B show the spring elements **6*a*, 6*b*, 6*c*, 6*d*** and *e* in greater detail. Each spring element has a protruding portion **60*a* or 60*b* or 60*c* or 60*d* or 60*e* that is adapted to engage a conductive strip on the associated panel 4 or 5. As seen in FIG. 2B, the thickness dimension of panel 4 is greater than the spacing between the protruding (projecting) portions of the spring elements. When the panel is inserted downwardly into groove 2** the spring elements are forced apart so as to have pressure contact on the panel faces (conductive strips). Spring element *6a* includes a lower free end *68a* that is engaged against side surfaces of groove bottom wall 11. The other spring elements *6b*, *6c*, *6d* and *6e* have free upper ends that are located in square holes 13 formed in the upper end face of the connector body 1. The lower end of each spring element is anchored to the connector body to form a fixed terminal 66. It will be noted that projecting contact portions *60a*, *60b*, *60c*, *60d* and *60e* are spaced different distances from groove bottom wall 11.

Figure 1A:
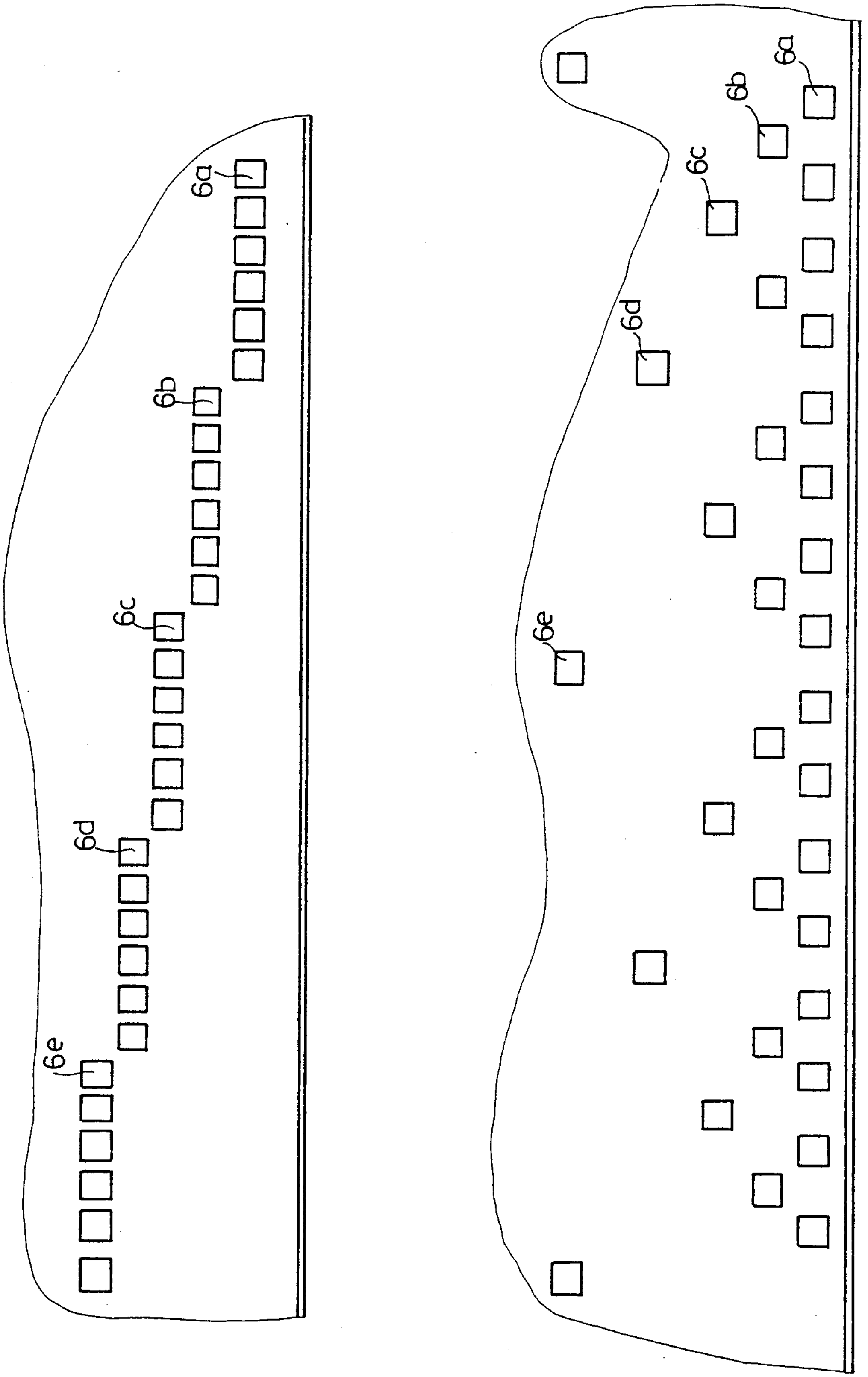

FIG. 1A shows two arrangements of the spring elements that can be used when locating the spring elements along the side surfaces of groove 2; each square in FIG. 1A indicates a projecting contact portion of a spring element, the double line represents the bottom wall 11 of groove 2.

The arrangement in the lower portion of FIG. 1A has the contact portions for spring elements *6a* a very closely spaced and in near adjacency to the groove bottom wall; the contact portions for the other spring elements *6b*, *6c*, *6d*, and *6e* are progressively spaced further distances away from groove bottom wall 11, while the lateral spacing between adjacent spring elements is progressively increased.

The arrangement shown in the upper portion of FIG. 1A has a multiplicity of spring elements 6a grouped together, a multiplicity of spring elements 6b grouped together, etc. The specific arrangement employed will be related to the conductive strip locations on panel 4 or 5. When panel 4 or panel 5 is fully inserted into groove 2 all of the contact portions (spring elements *6a*, *6b*, *6c*, *6d* and *6e*) will be engaged with conductive strips on the panel. When panel 4 or 5 is inserted four fifths of the complete insertion distance the contact portions of all spring elements except elements 6a will be engaged with conductive strips on the inserted panel. The number of spring elements in circuit is progressively decreased as the panel 4 or 5 is inserted to a point three fifths or two fifths or one fifth of the complete insertion distance.

Groove 2 comprises two relatively long side walls having vertical recesses 7 spaced laterally therealong to accommodate the various spring elements *6a*, *6c*, *6d*, and *6e*. Groove 2 is further defined by two relatively short transverse end walls at opposite ends of side walls 7. Two facing guide slots 12 are formed in groove side walls 7 in close proximity to each groove end wall; each guide slot 12 extends from groove bottom wall to the exposed upper face of the connector body.

As shown in FIG. 1, there are four ssets of spacer pads, numbered *12a*, *12b*, *12c* and *12d*. Each sset of pads comprises two pads adapted for removable disposition at opposite ends of groove 2, i.e. adjacent the groove end walls. Each spacer pad has two oppositely projecting guide ribs adapted to extend into the facing guide slots 12, 12 in groove side walls 7. In the illustrated arrangement all eight spacer pads (*12a*, *12b*, *12c* and *12d*) have the same vertical thickness; that thickness is numerically the same as the vertical distance between the projecting portions *60a*, *6b*, *60c*, *60d* and *60e* (FIG. 2B).

When none of the eight spacer pads is used in connector body 1 the associated panel 4 or 5 can be inserted into groove 2 until the edge of the panel contacts groove bottom wall 11; the insertion length of the panel (the portion of the panel within the groove) is then at a maximum.

Claim 14 adds to claim 14 in reciting the lateral spacing differences between the spring elements in the different groups of elements. This feature enables a relatively great number of conductive strip spacings to be accommodated with a given dielectric body. The different lateral spacings are most visible in Fig. 1A (lower illustration). In Andrews the lateral spacing of the upper conductive elements 24 is the same as the lateral spacing of the lower conductive elements 26. Andrews is not believed to teach the specific structure recited in claim 14.

Claim 16 recites features whereby all of the spacer pads *12a*, *12b*, 12 c and *12d* can be identical. This will reduce the numbers of different types of pads required to be kept in inventory, thereby somewhat decreasing total system expense without sacrificing total system expense without sacrificing versatility. The art is not believed to suggest the specific structure of claim 16.

Figure 3:
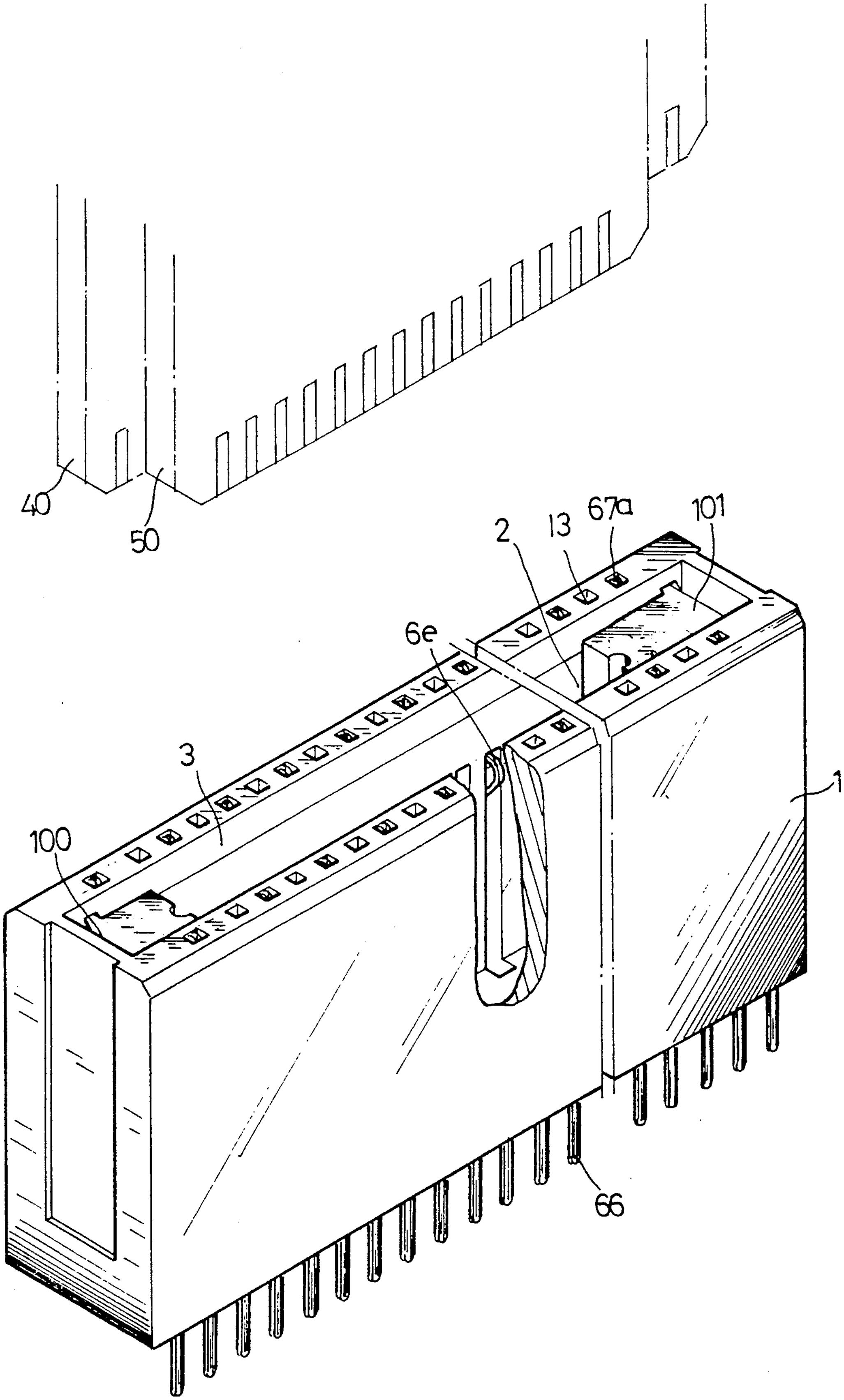
FIG. 3 is a view taken in the same direction as FIG. 1, and showing certain add-on spacer blocks used to reduce the effective width of a panel-insertion groove in the connector body.
Figure 4:
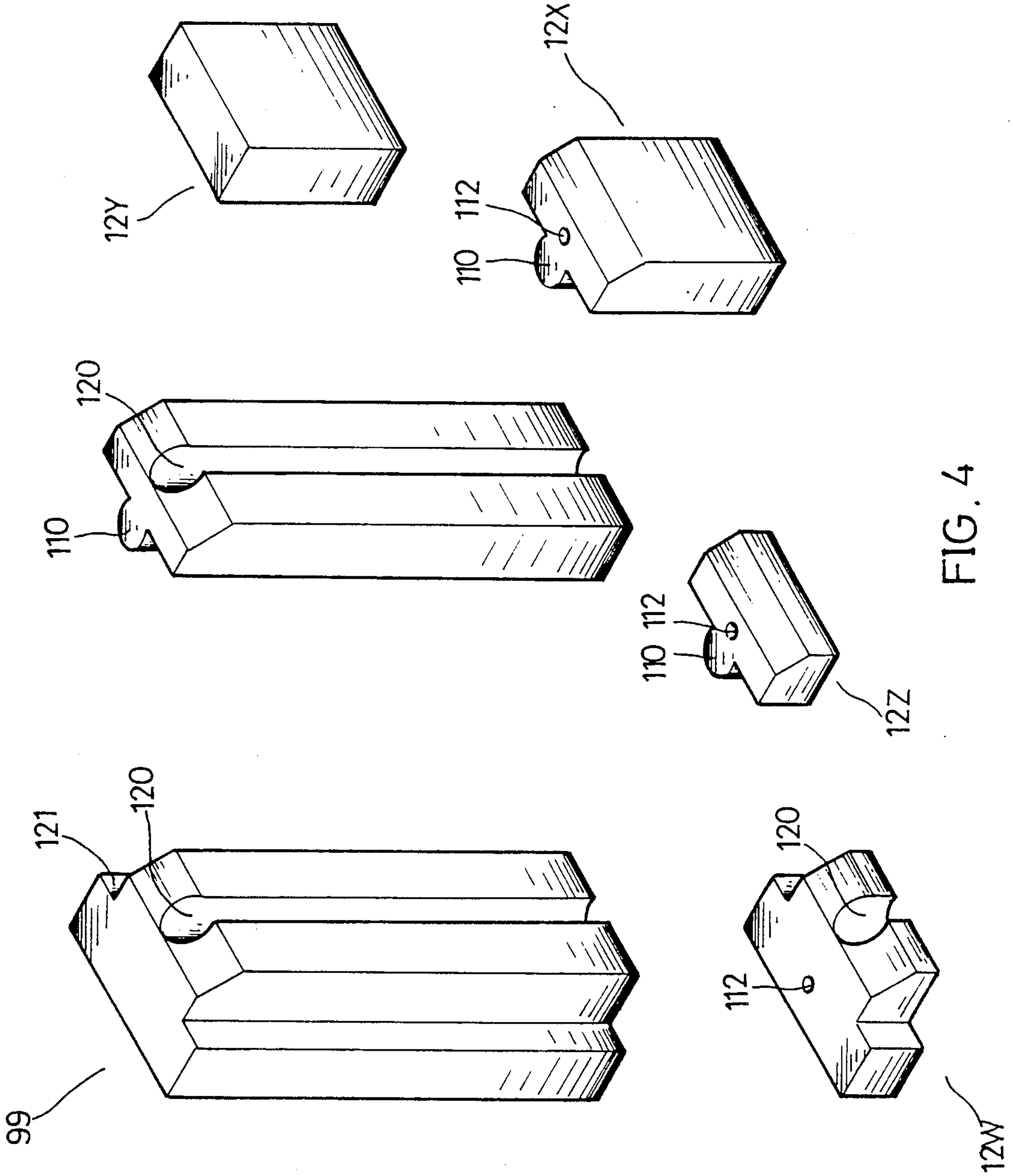
FIG. 4 shows spacer blocks and additional spacer pads that can be used in the FIG. 1 connector.
Figure 5:
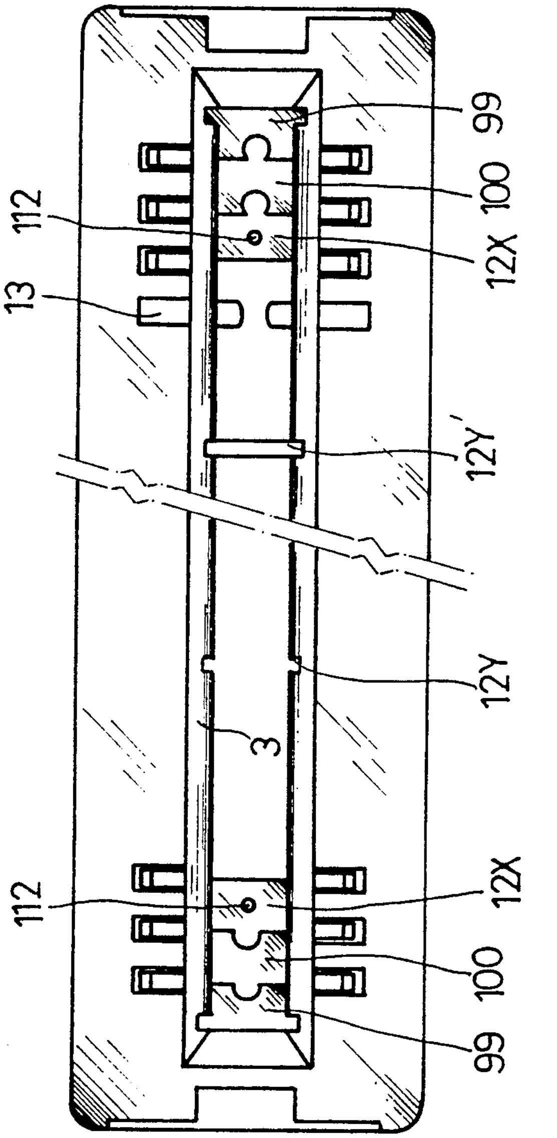
FIG. 5 is an end view of the FIG. 1 connector, showing a number of spacer blocks installed into opposite end areas of the panel-reception groove.

Claims 17 and 18 add the removable spacer blocks shown at 99, 100 and 101 (FIGS. 3, 4 and 5). These spacer blocks enable a given dielectric body to be used for reception of panels having differing transverse width dimensions. None of the prior art patents appears to show this feature. Allowance of claims 17 and 18 is believed to be warranted.

It will be seen that by using spacer blocks at the ends of groove 2 it is possible to effectively reduce the width dimension of groove 2, thereby enabling the groove to accept panels having reduced width dimensions (and different conductive strip spacings).

A single spacer block may be used at each end of groove 2, as shown in FIG. 3. Alternately, a plural number of spacer blocks can be used at each end of groove 2, as shown in FIG. 5 (per spacer blocks 99 and 100).

The exposed edges of the spacer blocks facing the groove 2 space preferably have locking slots 120 extending therealong (as best seen in FIG. 4). Additional spacer pads *12x*, or *12x* have locking ribs 110 adapted to have interlocking fits in locking slots 120. These additional spacer pads *12x* and *12x* serve the same function as previously-referenced spacer pads *12a*, *12b*, *12c* and *12d*, except that pads *12x* and *12z* are used only in conjunction with blocks 99, 100 and 101, when groove 2 is modified to accept panels having reduced width dimensions. FIG. 3 shows in phantom two panels 40 and 50 having different transverse width dimensions. Panel 40 is a full width panel that will be used without any spacer blocks in the ends of groove 2. Panel 50 is a reduced width panel usable when spacer blocks 100 and 101 are installed in opposite ends of groove 2.

Figure 6:
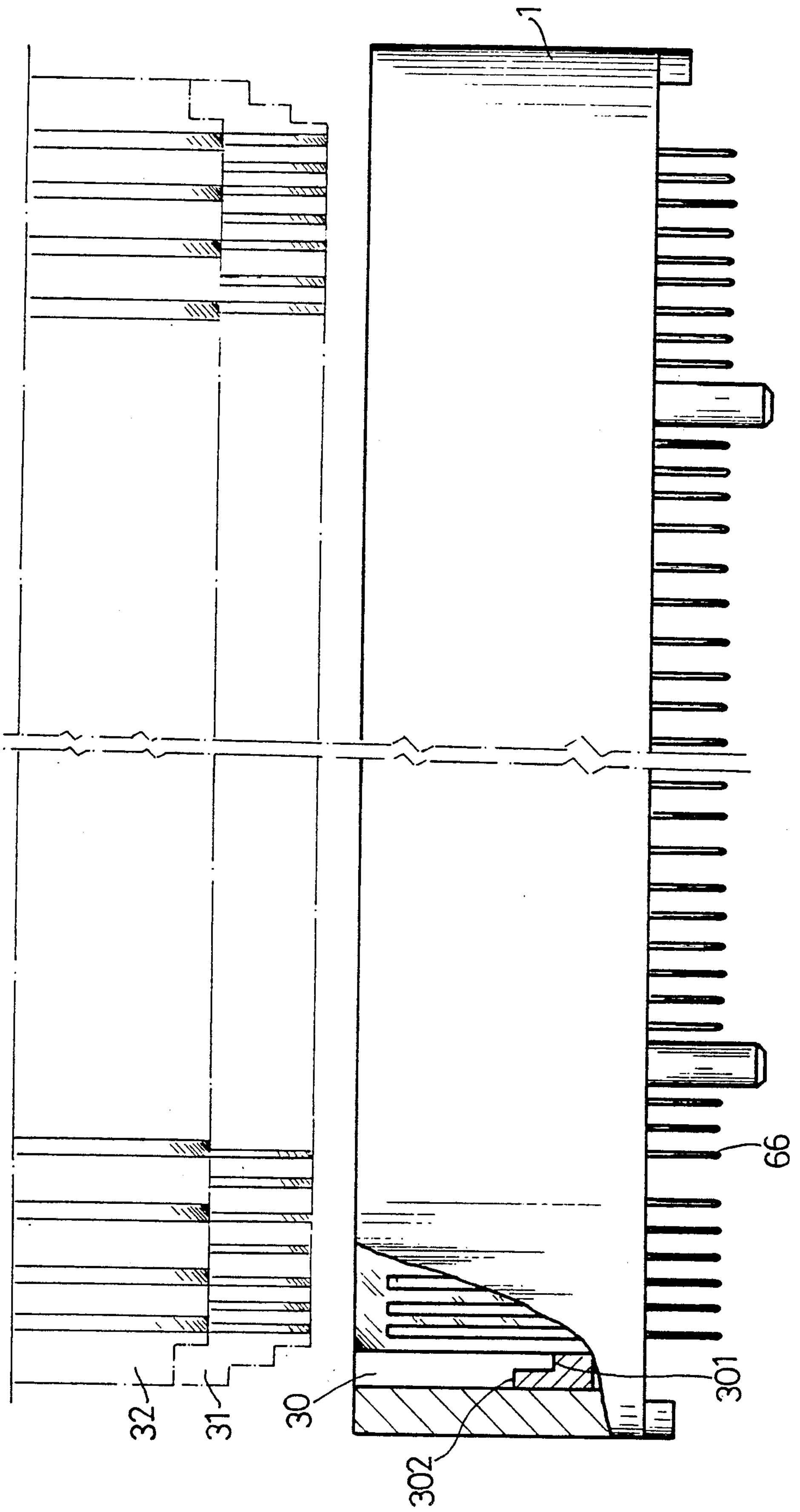
FIG. 6 is am exploded view of a panel-connector arrangement that can be used in practice of the invention.

FIG. 6 illustrates an arrangement wherein a spacer pad at an end of the panel-reception groove has a stepped configuration adapted to mate with a stepped edge configuration on an associated panel 31 or 32. Either the stepped configuration of FIG. 6 or the non-stepped configuration of FIG. 1 can be used.

The invention is concerned primarily with the use of spacer pads *12a*, *12b*, *12c* and *12d* in conjunction with the construction of the conductive spring elements having contact portions *60a*, *60b*, *60c*, *60d* and *60e* spaced varying distances from groove bottom wall 12, whereby different circuit connections can be established between connector body 1 and the inserted plug-in panel, depending on the selective use of the various spacer pads. The use of spacer blocks 99, 100 and 101 gives the connector system a further measure of versatility in that it enables a given connector body 1 to be used with a range of different width plug-in panels.

I claim:

1. A multi-purpose PC board connector for use with dielectric panels wherein the panels have parallel elongated conductive strips extending therealong: said connector comprising a dielectric body having an exposed face presentable to an edge of a panel, and a panel-reception groove extending from said exposed face into the dielectric body; said groove being defined by a groove bottom wall, two longitudinal side walls extending from said bottom wall, and two transverse end walls extending from the bottom wall at opposite ends of the side walls; a plural number of parallel conductive spring elements mounted in said body so that each spring element extends within one of the groove side walls normal to the groove bottom wall; each spring element having an electrical contract portion thereof projecting beyond the plane of the groove side surface into the groove space, whereby insertion of a panel into the groove causes the conductive strips on the panel to engage the contact portions of the spring elements;

said conductive spring elements including a first group of elements having their contact portions spaced a relatively small distance from the groove bottom wall, a second group of elements having their contact portions spaced a second intermediate distance from the groove bottom wall, and a third group of elements having their contact portions spaced a third relatively great distance from the groove bottom wall; two facing guide slots (12) formed in the groove side walls in close proximity to each groove end wall, each guide slot extending from the groove bottom wall to said exposed face of the dielectric body; and at least one spacer pad adapted for removal disposition within said groove at each groove end wall; each spacer pad having two laterally projecting guide ribs extending in opposite directions for slidable accommodation in said facing guide slots, whereby when a dielectric panel is inserted into the groove a transverse edge of the panel will strike the spacer pads at opposite ends of the groove; said spacer pads including multiple sets of pads having thickness selected to vary the insertion length of the panel into the groove, such that the conductive strips on the panel are in contact with all three groups of spring elements, or only the second and third groups of spring elements, or only the third group of spring elements.

2. The connector of claim 1, wherein the elements in said first group of spring elements have a first lateral spacing, the elements in said second group of spring elements have a second lateral spacing, and the elements in said third group of spring elements have a third lateral spacing.

3. The connector of claim 1, wherein each spacer pad has an extractor pad and an extractor hole extending therethrough essentially parallel to the associated guide ribs.

4. The connector of claim 1, wherein the difference between said relatively small distance and said intermediate distance is the same as the difference between said intermediate distance and said relatively great distance; each set of pads having the same thickness as the common difference in spacing of the contact portions from the groove bottom wall, whereby the pads are interchangeable when varying the insertion length of the panel into the groove.

5. The connector of claim 1, and further comprising multiple elongated spacer blocks, each block having a longitudinal dimension equal to the distance between the groove bottom wall and the exposed face of the connector body; each spacer block having a transverse width dimension equal to the groove width defined by the spacing of the groove side walls; each spacer block having two laterally projecting guide ribs extending in opposite directions for slidable accommodation in the facing guide slots at either end of the panel-insertion groove; said spacer blocks being adapted for disposition along the groove end walls to reduce the effective width dimension of the two groove, whereby the groove can be mated to dielectric panels having reduced insertional width dimensions.

6. The connector of claim 5, and further comprising additional spacer pads adapted for stacking the groove bottom wall in the spaces alongside respective ones of the spacer blocks; each said spacer block having a locking slot extending therealong in facing relation to the groove space; each said additional spacer pad having a locking rib adapted to having an interlocking fit in a locking slot of the associated spacer block.

* * * * *